(12) United States Patent
Zhang

(10) Patent No.: US 11,830,913 B2
(45) Date of Patent: Nov. 28, 2023

(54) SEMICONDUCTOR DEVICE AND FABRICATION METHOD THEREOF

(71) Applicant: INNOSCIENCE (SUZHOU) TECHNOLOGY CO., LTD., Suzhou (CN)

(72) Inventor: Anbang Zhang, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 253 days.

(21) Appl. No.: 17/257,000

(22) PCT Filed: Oct. 28, 2020

(86) PCT No.: PCT/CN2020/124248
§ 371 (c)(1),
(2) Date: Dec. 29, 2020

(87) PCT Pub. No.: WO2022/087869
PCT Pub. Date: May 5, 2022

(65) Prior Publication Data
US 2022/0310789 A1    Sep. 29, 2022

(51) Int. Cl.
*H01L 29/778* (2006.01)
*H01L 29/10* (2006.01)
(Continued)

(52) U.S. Cl.
CPC ........ *H01L 29/10* (2013.01); *H01L 29/42316* (2013.01); *H01L 29/66462* (2013.01);
(Continued)

(58) Field of Classification Search
None
See application file for complete search history.

(56) References Cited

U.S. PATENT DOCUMENTS

2002/0066908 A1*  6/2002  Smith .............. H01L 29/7783
                                                  257/E29.127
2006/0019435 A1   1/2006  Sheppard et al.
(Continued)

OTHER PUBLICATIONS

First Office Action of the corresponding China patent application No. 202080003452.9 dated Mar. 17, 2022.
(Continued)

*Primary Examiner* — Christopher A Johnson
(74) *Attorney, Agent, or Firm* — Li & Cai Intellectual Property (USA) Office

(57) ABSTRACT

The present disclosure provides a semiconductor device and a fabrication method thereof. The semiconductor device includes a first nitride semiconductor layer, a second nitride semiconductor layer, a doped group III-V semiconductor layer and a gate layer. The first nitride semiconductor layer has a first surface. The second nitride semiconductor layer is formed on the first surface of the first nitride semiconductor layer and has a greater bandgap than that of the first nitride semiconductor layer. The doped group III-V semiconductor layer is over the second nitride semiconductor layer. The doped group III-V semiconductor layer includes a first portion and a second portion having different thicknesses. The gate layer is disposed on the first portion and the second portion of the doped group III-V semiconductor layer.

8 Claims, 6 Drawing Sheets

(51) Int. Cl.
*H01L 29/423* (2006.01)
*H01L 29/66* (2006.01)
H01L 29/20 (2006.01)
H01L 29/205 (2006.01)

(52) U.S. Cl.
CPC ...... *H01L 29/7786* (2013.01); *H01L 29/2003* (2013.01); *H01L 29/205* (2013.01)

(56) References Cited

U.S. PATENT DOCUMENTS

| | | | |
|---|---|---|---|
| 2007/0018199 A1* | 1/2007 | Sheppard | H01L 29/66462 257/E29.127 |
| 2008/0093626 A1 | 4/2008 | Kuraguchi | |
| 2011/0057257 A1* | 3/2011 | Park | H01L 29/7787 438/270 |
| 2011/0127540 A1 | 6/2011 | Yamada et al. | |
| 2012/0112202 A1 | 5/2012 | Hwang et al. | |
| 2013/0075752 A1 | 3/2013 | Kotani | |
| 2014/0097468 A1 | 4/2014 | Okita et al. | |
| 2015/0123141 A1 | 5/2015 | Yoshioka et al. | |
| 2015/0318387 A1 | 11/2015 | Chiu et al. | |
| 2016/0315180 A1 | 10/2016 | Tanaka et al. | |
| 2017/0207300 A1 | 7/2017 | Pei et al. | |
| 2019/0229209 A1* | 7/2019 | Lee | H01L 29/1066 |

OTHER PUBLICATIONS

International Search Report and Written Opinion of the corresponding PCT application No. PCT/CN2020/124248 dated May 27, 2021.
China Patent Office, second Office action regarding China patent application No. 202080003452.9 dated Mar. 30, 2023.

* cited by examiner

SEMICONDUCTOR DEVICE AND FABRICATION METHOD THEREOF

BACKGROUND

1. Technical Field

The present disclosure relates to a semiconductor device and a fabrication method thereof, and more particularly to a semiconductor device including a doped group III-V semiconductor layer and a fabrication method thereof.

2. Description of the Related Art

Components including direct bandgap semiconductors, for example, semiconductor components including group III-V materials or group III-V compounds (Category: III-V compounds) can operate or work under a variety of conditions or in a variety of environments (e.g., at different voltages and frequencies) due to their characteristics.

The semiconductor components may include a heterojunction bipolar transistor (HBT), a heterojunction field effect transistor (HFET), a high-electron-mobility transistor (HEMT), a modulation-doped FET (MODFET) and the like.

SUMMARY OF THE INVENTION

In some embodiments of the present disclosure, a semiconductor device is provided, which includes a first nitride semiconductor layer, a second nitride semiconductor layer, a doped group III-V semiconductor layer and a gate layer. The first nitride semiconductor layer has a first surface. The second nitride semiconductor layer is formed on the first surface of the first nitride semiconductor layer and has a greater bandgap than that of the first nitride semiconductor layer. The doped group III-V semiconductor layer is over the second nitride semiconductor layer. The doped group III-V semiconductor layer includes a first portion and a second portion having different thicknesses. The gate layer is disposed on the first portion and the second portion of the doped group III-V semiconductor layer.

In some embodiments of the present disclosure, a semiconductor device is provided, which includes a first nitride semiconductor layer, a second nitride semiconductor layer, a doped group III-V semiconductor layer and a gate layer. The first nitride semiconductor layer has a first surface. The second nitride semiconductor layer is formed on the first surface of the first nitride semiconductor layer and has a greater bandgap than that of the first nitride semiconductor layer. The doped group III-V semiconductor layer is over the second nitride semiconductor layer, and the doped group III-V semiconductor layer has a recess. The gate layer is disposed on the doped group III-V semiconductor layer. The gate layer includes a first portion extending into the recess of the doped group III-V semiconductor layer.

In some embodiments of the present disclosure, a method for manufacturing a semiconductor device is provided. The method includes forming a first nitride semiconductor layer, and forming a second nitride semiconductor layer on a first surface of the first nitride semiconductor layer, the second nitride semiconductor layer having a greater bandgap than that of the first nitride semiconductor layer. The method also includes forming a doped group III-V semiconductor layer over the second nitride semiconductor layer, and forming a recess in the doped group III-V semiconductor layer. The method further includes forming a gate layer on the doped group III-V semiconductor layer and extending into the recess of the doped group III-V semiconductor layer.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

PREFERRED EMBODIMENT OF THE PRESENT INVENTION

Figure 1:
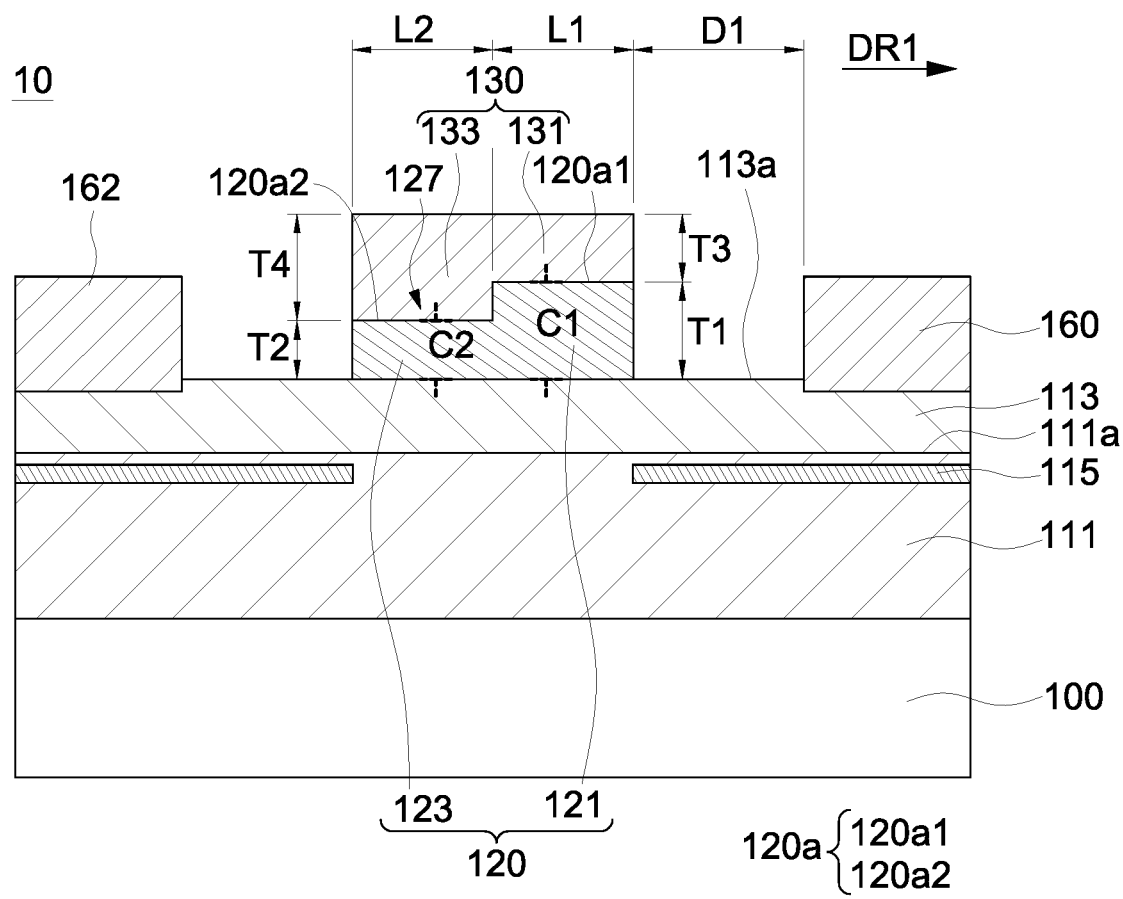
FIG. 1 is a cross-sectional view of a semiconductor device according to some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Referring to FIG. 1, which illustrates a cross-sectional view of a semiconductor device 10 according to some embodiments of the present disclosure. The semiconductor device 10 can work in various voltage levels. For example, the semiconductor device 10 can work in a relatively great voltage level (e.g., equal to or greater than approximately 200 V). For example, the semiconductor device 10 can also work in a relatively low voltage level (e.g., from about 10 V to about 20 V).

The semiconductor device 10 may include a substrate 100, nitride semiconductor layers 111 and 113, a doped group III-V semiconductor layer 120, a gate layer 130, a drain electrode 160, and a source electrode 162.

The substrate 100 may include, without limitation, silicon (Si), doped Si, silicon carbide (SiC), germanium silicide (SiGe), gallium arsenide (GaAs), sapphire, silicon on insulator (SOI), or other suitable material(s). The substrate 100 may further include a doped region, for example, a p-well, an n-well, or the like. The substrate 100 may include impurity. The substrate 100 may include a p-type silicon substrate.

The nitride semiconductor layer 111 may be formed on the substrate 100. The nitride semiconductor layer 111 has a surface 111a. The nitride semiconductor layer 111 may include, without limitation, a group III nitride, for example, a compound $In_xAl_yGa_{1-x-y}N$, in which $x+y \leq 1$. The group III nitride may further include, but is not limited to, for example, a compound $Al_yGa_{(1-y)}N$, in which $y \leq 1$. For example, the nitride semiconductor layer 111 may include a GaN layer having a bandgap of about 3.4 eV.

The nitride semiconductor layer 113 may be formed on the surface 111a of the nitride semiconductor layer 111. The nitride semiconductor layer 113 may have a greater bandgap than that of the nitride semiconductor layer 111. The nitride semiconductor layer 113 may be in direct contact with the nitride semiconductor layer 111. The nitride semiconductor layer 113 may include, without limitation, a group III nitride, for example, a compound $In_xAl_yGa_{1-x-y}N$, in which $x+y \leq 1$. The group III nitride may further include, but is not limited to, for example, a compound $Al_yGa_{(1-y)}N$, in which $y \leq 1$. For example, the nitride semiconductor layer 113 may include AlGaN having a band gap of about 4 eV.

A heterojunction may be formed between the nitride semiconductor layer 111 and the nitride semiconductor layer 113, e.g., at an interface of the nitride semiconductor layer 111 and the nitride semiconductor layer 113, and the polarization of the heterojunction of different nitrides forms a two-dimensional electron gas (2DEG) region 115 adjacent to the interface of the nitride semiconductor layer 111 and the nitride semiconductor layer 113. The 2DEG region 115 may be formed in the nitride semiconductor layer 111. The nitride semiconductor layer 111 can provide electrons to or remove electrons from the 2DEG region 115, thereby controlling the conduction of the semiconductor device 10. Although it is not illustrated in FIG. 1 for simplification, however, it is contemplated that a super lattice layer may be formed between the substrate 100 and the stack of nitride semiconductor layers 111 and 113 to facilitate operation of the semiconductor device 10 in a relatively high voltage level.

The doped group III-V semiconductor layer 120 may be over the nitride semiconductor layer 113. The doped group III-V semiconductor layer 120 may be or include a p-type doped group III-V layer. The doped group III-V semiconductor layer 120 may be made of or include an epitaxial p-type III-V material. The doped group III-V semiconductor layer 120 may include, for example, but is not limited to, group III nitride, for example, a compound $Al_yGa_{(1-y)}N$, in which $y \leq 1$. A material of the doped group III-V semiconductor layer 120 may be or include p-type doped GaN.

The doped group III-V semiconductor layer 120 may include a portion 121 and a portion 123 having different thicknesses. Accordingly, the capacitance C1 at the portion 121 of the doped group III-V semiconductor layer 120 may be different from the capacitance C2 at the portion 123 of the doped group III-V semiconductor layer 120. The different capacitances C1 and C2 within the doped group III-V semiconductor layer 120 may reshape the electric field within the doped group III-V semiconductor layer 120 of the semiconductor device 10 and determine the threshold voltage of the semiconductor device 10.

A difference between a thicknesses T1 of the portion 121 and a thicknesses T2 of the portion 123 of the doped group III-V semiconductor layer 120 may be from about 5 nm to about 100 nm. The difference between the thicknesses T1 of the portion 121 and the thicknesses T2 of the portion 123 of the doped group III-V semiconductor layer 120 may be from about 5 nm to about 50 nm. The difference between the thicknesses T1 of the portion 121 and the thicknesses T2 of the portion 123 of the doped group III-V semiconductor layer 120 may be from about 5 nm to about 20 nm. A ratio ((T1−T2)/T1) of the difference between the thicknesses T1 and the thicknesses T2 to the thicknesses T1 of the portion 121 may be from about 0.1 to about 1. The thickness T1 of the portion 121 of the doped group III-V semiconductor layer 120 may be from about 10 nm to about 40 nm.

The doped group III-V semiconductor layer 120 and the drain electrode 160 are separated by a distance D1 along a direction DR1 substantially parallel to the surface 111a of the nitride semiconductor layer 111. The distance D1 may vary according to the working voltage level of the semiconductor device 10. The distance D1 may be equal to or greater than about 30 nm. The distance D1 may be from about 30 nm to about 500 nm. The distance D1 may be from about 300 nm to about 1000 nm. The distance D1 may be from about 500 nm to about 1000 nm. The distance D1 may be from about 600 nm to about 2000 nm. The distance D1 may be from about 1000 nm to about 1500 nm. The distance D1 may be from about 1000 nm to about 2000 nm. The distance D1 may be from about 1500 nm to about 4000 nm. The distance D1 may be from about 2000 nm to about 20000 nm. The distance D1 may be greater than about 20000 nm. A ratio ((T1−T2)/D1) of the difference between the thicknesses T1 and the thicknesses T2 to the distance D1 may be from about 0.005 to about 0.5.

The thickness T1 of the portion 121 of the doped group III-V semiconductor layer 120 may be greater than the thickness T2 of the portion 123 of the doped group III-V semiconductor layer 120. Accordingly, the capacitance C1 at the portion 121 of the doped group III-V semiconductor layer 120 may be less than the capacitance C2 at the portion 123 of the doped group III-V semiconductor layer 120. As a result, the electric field adjacent to the drain electrode 160 may be reduced as charges may be drawn from the portion 121 towards the portion 123 due to the difference in capacitances, resulting in a relatively uniform electric field distribution within the doped group III-V semiconductor layer 120, and thus the breakdown voltage can be increased. Therefore, less layers and/or numbers of field plates are required to be arranged in the semiconductor device 10, the distance (or space) between the doped group III-V semiconductor layer 120 and the drain electrode 160 reserved for the arrangement of field plates can be reduced while a relatively uniform electric field distribution within the doped group III-V semiconductor layer 120 can be provided. Hence, the size of the semiconductor device 10 can be reduced, and the manufacturing process of the semiconductor device 10 can be simplified.

The portion 121 of the doped group III-V semiconductor layer 120 has a length L1 along the direction DR1, and the portion 123 of the doped group III-V semiconductor layer 120 has a length L2 along the direction DR1. The length L1 may be greater than the length L2. The portion 121 with a relatively small capacitance C1 may be adjacent to the drain electrode 160 and have a relatively long length L1. Accordingly, the electric field adjacent to the drain electrode 160 may be reduced due to the difference in capacitances C1 and C2, a relatively uniform electric field distribution within the doped group III-V semiconductor layer 120 may be generated among a relatively large region (e.g., a region along the length L1), and thus the breakdown voltage of the semiconductor device 10 can be significantly increased.

The doped group III-V semiconductor layer 120 may have a recess 127. The doped group III-V semiconductor layer 120 may have a surface 120a facing the gate layer 130, the surface 120a of the doped group III-V semiconductor layer 120 may include a part 120a1 and a part 120a2 adjacent to the part 120a1, and the part 121a1 and the part 121a2 may be at different elevations. The recess 127 may be recessed from the part 120a1 of the surface 120a of the doped group III-V semiconductor layer 120. A depth (i.e., the difference between the thickness T1 and the thickness T2) of the recess 127 may be from about 5 nm to about 100 nm.

The gate layer 130 may be disposed on the doped group III-V semiconductor layer 120. The gate layer 130 may be disposed on the portion 121 and the portion 122 of the doped group III-V semiconductor layer 120. The gate layer 130 may directly contact the portion 121 and the portion 122 of the doped group III-V semiconductor layer 120. The gate layer 130 may directly contact the part 120a1 and the part 120a2 of the surface 120a of the doped group III-V semiconductor layer 120.

The gate layer 130 may include portions 131 and 133. The portion 133 may extend into the recess 127 of the doped group III-V semiconductor layer 120. The portion 133 of the gate layer 130 may directly contact a surface 120a2 (also referred to as "a bottom surface") of the recess 127 of the doped group III-V semiconductor layer 120. The portion 131 of the gate layer 130 may directly contact the part 120a1 of the surface 120a of the doped group III-V semiconductor layer 120. A thickness T4 of the portion 133 of the gate layer 130 may be greater than a thickness T3 of the portion 131 of the gate layer 130.

The gate layer 130 may include a conductive layer. The gate layer 130 may be or include a gate metal. The gate metal may include, for example, but is not limited to, titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials.

The 2DEG region 115 formed under the doped group III-V semiconductor layer 120 may be preset to be in an OFF state when the gate layer 130 is in a zero-bias state, as illustrated in FIG. 1. When a voltage is applied to the gate layer 130, electrons or charges are induced in the 2DEG region 115 below the gate layer 130. When the voltage increases, the number of induced electrons or charges increases as well. Such a device can be referred to as an enhancement-mode device.

The drain electrode 160 may be disposed proximal to the portion 121 of the doped group III-V semiconductor layer 120. The drain electrode 160 may be disposed proximal to the part 120a1 of the surface 120a of the doped group III-V semiconductor layer 120. The source electrode 162 may be disposed on a side of the gate layer 130 opposite to the drain electrode 160. The drain electrode 160 and the source electrode 162 may include, for example, without limitation, a conductor material. The conductor materials may include, but are not limited to, for example, metals, alloys, doped semiconductor materials (e.g., doped crystalline silicon), or other suitable conductor materials.

Figure 2:
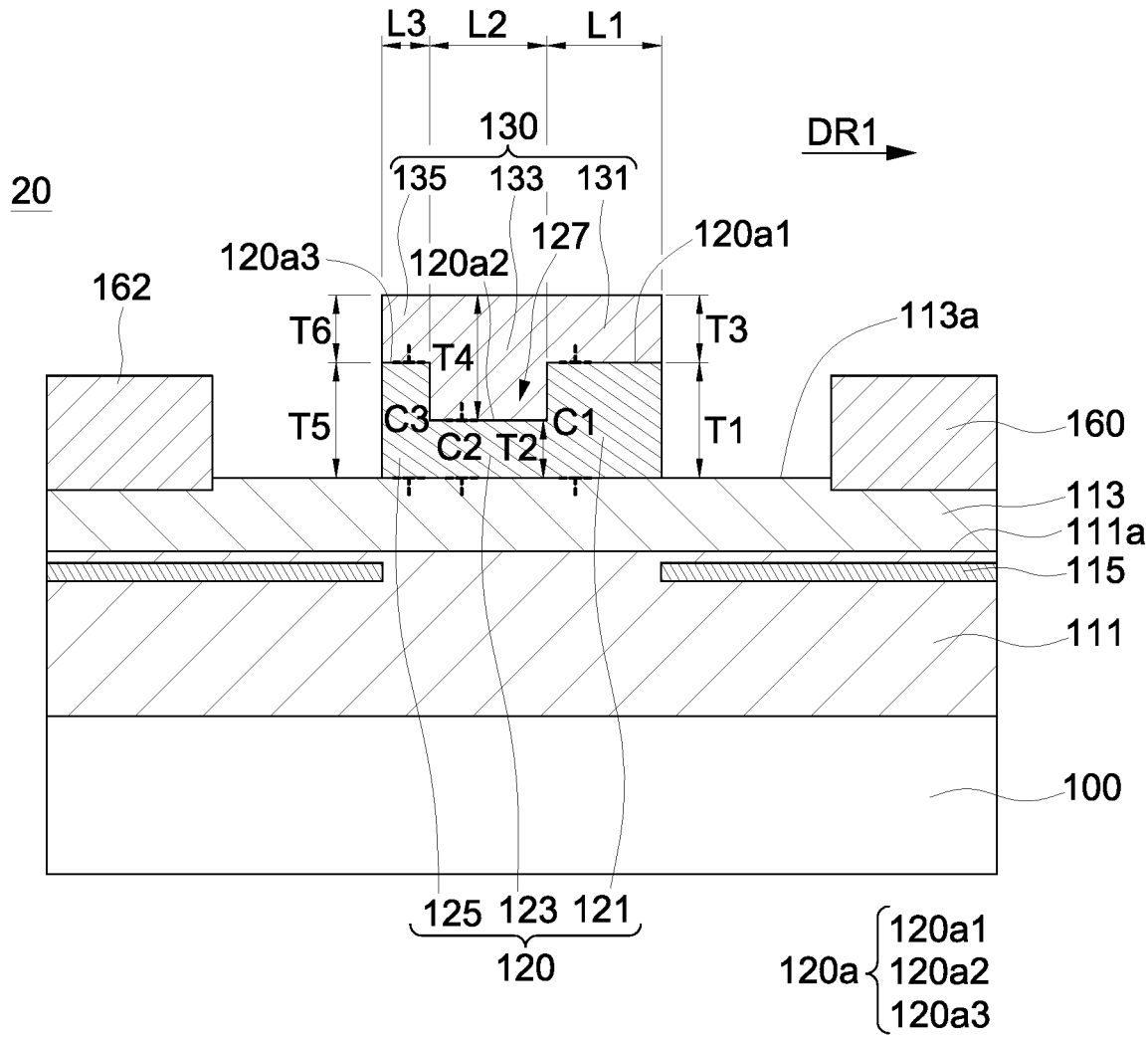
FIG. 2 is a cross-sectional view of a semiconductor device according to some embodiments of the present disclosure.

FIG. 2 is a cross-sectional view of a semiconductor device 20 according to some embodiments of the present disclosure. The semiconductor device 20 has a structure similar to the semiconductor device 10 shown in FIG. 1, except that, for example, the doped group III-V semiconductor layer 120 may further include a portion 125.

The second portion 123 is between the portion 121 and portion 125 of the doped group III-V semiconductor layer 120. A thickness T5 of the portion 125 of the doped group III-V semiconductor layer 120 may be greater than the thickness T2 of the portion 123 of the doped group III-V semiconductor layer 120. Accordingly, the capacitance C3 at the portion 125 of the doped group III-V semiconductor layer 120 may be less than the capacitance C2 at the portion 123 of the doped group III-V semiconductor layer 120, thus the electric field adjacent to the source electrode 162 may be reduced due to the difference in the capacitances C2 and C3, resulting in a relatively uniform electric field distribution within the doped group III-V semiconductor layer 120, and thus the breakdown voltage can be increased. The thickness T5 of the portion 125 of the doped group III-V semiconductor layer 120 may be substantially the same as the thickness T1 of the portion 121 of the doped group III-V semiconductor layer 120. The portion 125 of the doped group III-V semiconductor layer 120 has a length L3 along the direction DR1. The length L1 of the portion 121 may be greater than the length L3 of the portion 125.

The gate layer 130 may further include a portion 135. The portion 135 may directly contact a surface 120a3 of the portion 125 of the doped group III-V semiconductor layer 120. A thickness T6 of the portion 135 of the gate layer 130 may be less than the thickness T4 of the portion 133 of the gate layer 130. The thickness T6 of the portion 135 of the gate layer 130 may be substantially the same as the thickness T3 of the portion 131 of the gate layer 130.

Figure 3:
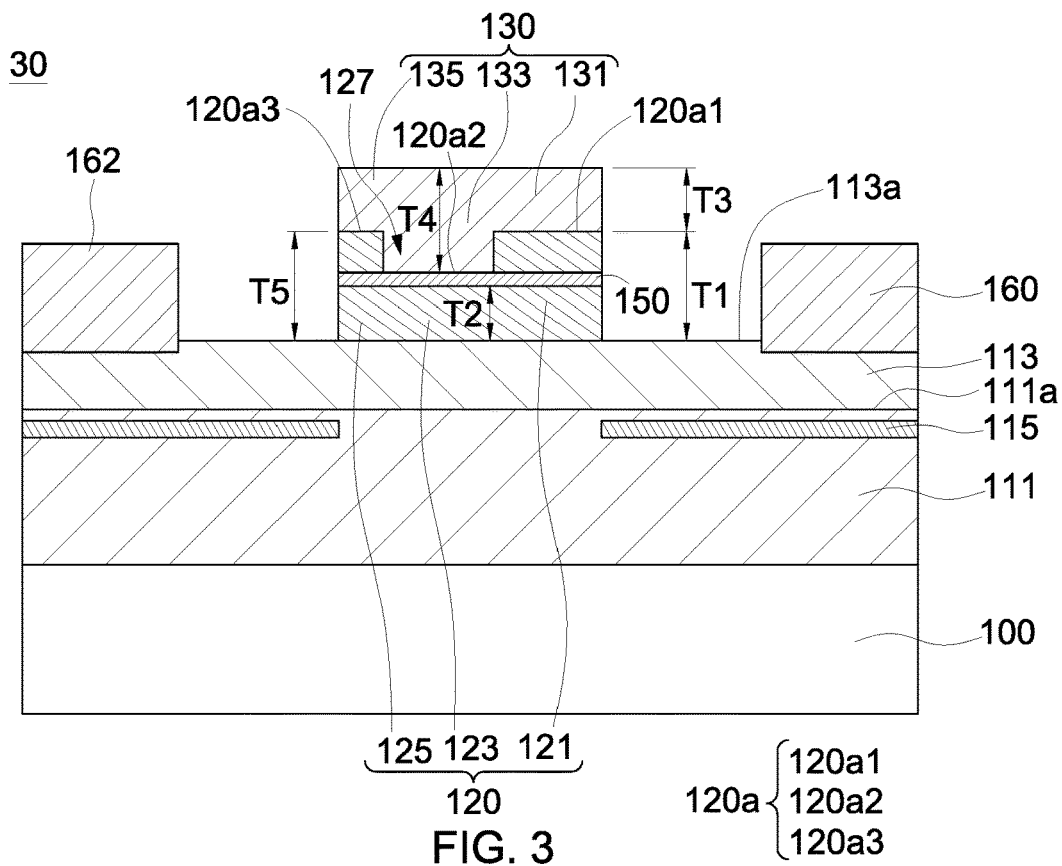
FIG. 3 is a cross-sectional view of a semiconductor device according to some embodiments of the present disclosure.

FIG. 3 is a cross-sectional view of a semiconductor device 30 according to some embodiments of the present disclosure. The semiconductor device 30 has a structure similar to the semiconductor device 20 shown in FIG. 2, except that, for example, the semiconductor device 30 may further include an etch stop layer 150.

The etch stop layer 150 may be disposed between the gate layer 130 and the portion 123 of the doped group III-V semiconductor layer 120. The etch stop layer 150 may be disposed between the portion 133 of the gate layer 130 and the doped group III-V semiconductor layer 120. The etch stop layer 150 may directly contact the portion 133 of the gate layer 130.

A portion of the etch stop layer 150 may be embedded in the portion 121 of the doped group III-V semiconductor layer 120. A portion of the etch stop layer 150 may be embedded in the portion 125 of the doped group III-V semiconductor layer 120.

Figure 4:
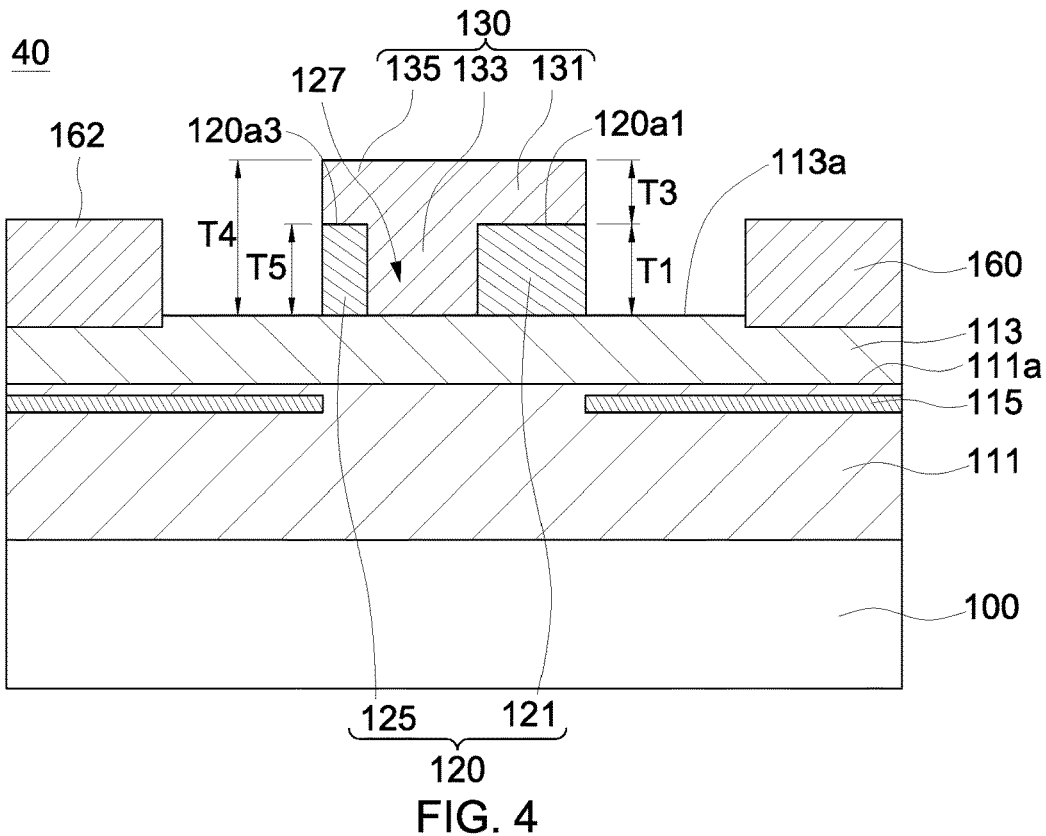
FIG. 4 is a cross-sectional view of a semiconductor device according to some embodiments of the present disclosure.

FIG. 4 is a cross-sectional view of a semiconductor device 40 according to some embodiments of the present disclosure. The semiconductor device 40 has a structure similar to the semiconductor device 20 shown in FIG. 2, except that, for example, the portion 133 of the gate layer 130 may directly contact the nitride semiconductor layer 113.

The portion 121 of the doped group III-V semiconductor layer 120 may be spaced apart from the portion 125 of the doped group III-V semiconductor layer 120 by the portion 133 of the gate layer 130.

Figure 5:
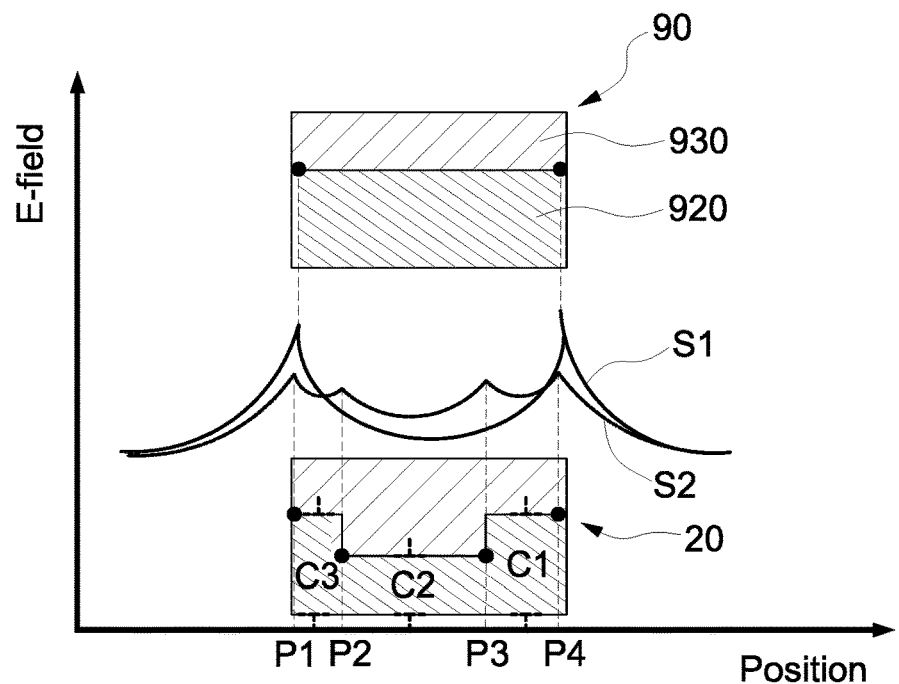
FIG. 5 illustrates electric field distributions of semiconductor devices according to some embodiments and comparative embodiments of the present disclosure.

FIG. 5 illustrates electric field distributions of semiconductor devices according to some embodiments and comparative embodiments of the present disclosure. In FIG. 5, curve S1 shows the electric field distribution of a semiconductor device 90 according to some comparative embodiments, and curve S2 shows the electric field distribution of the semiconductor device 20 according to some embodiments of the present disclosure. The semiconductor device 90 includes a doped group III-V semiconductor layer 920 and a gate layer 930 on the doped group III-V semiconductor layer 920. In FIG. 5, position P4 is adjacent to a drain electrode, and position P1 is adjacent to a source electrode.

As shown in FIG. 5, curve S1 shows that in the semiconductor device 90, the electric field is relatively high at the positions P1 and P4, and the electric field is relatively low at the positions P2 and P3. On the other hands, curve S2 shows that in the semiconductor device 20, the electric field among the positions P1, P2, P3 and P4 is relatively uniform. It is clear that without the design of the doped group III-V semiconductor layer 120 including portions having different thickness, the electric field distribution is relatively less uniform, and thus the threshold voltage and the breakdown voltage of the semiconductor device 90 is relatively low compared to that of the semiconductor device 20.

Table 1 below provides experimental results of some exemplary semiconductor devices and comparative exemplary semiconductor devices. Each of the exemplary semiconductor devices (E1-E9) can have a structure same or similar to the semiconductor device 10 as described and illustrated with reference to FIG. 1. Each of the comparative exemplary semiconductor devices (C1-C3) can have a structure same or similar to the semiconductor device 90 as described and illustrated with reference to FIG. 5. "D1" refers to the distance between the doped group III-V semiconductor layer 120/920 and the drain electrode. The thickness "T1" of the comparative exemplary semiconductor devices (C1-C3) refers to the thickness of the doped group III-V semiconductor layer 920. The units of "T1" and "D1" in table 1 are in nanometers (nm).

TABLE 1

|    | D1 | T1 | T1 − T2 | (T1 − T2)/T1 | (T1 − T2):D1 | Working voltage (V) |
|----|----|----|---------|--------------|--------------|---------------------|
| E1 | 30-500 | 10 | 5-20 | 0.1-1 | 0.005-0.5 | 10-100 |
| E2 | 500-1000 | 20 | 5-50 | 0.1-1 | 0.005-0.5 | 10-100 |
| E3 | 1000-2000 | 30 | 5-100 | 0.1-1 | 0.005-0.5 | 10-100 |
| C1 | 500-3000 | 10 | N/A | N/A | N/A | 10-100 |
| E4 | 300-1000 | 10 | 5-20 | 0.1-1 | 0.005-0.5 | 100-200 |
| E5 | 1000-1500 | 20 | 5-50 | 0.1-1 | 0.005-0.5 | 100-200 |
| E6 | 1500-4000 | 30 | 5-100 | 0.1-1 | 0.005-0.5 | 100-200 |
| C2 | 500-6000 | 10 | N/A | N/A | N/A | 100-200 |
| E7 | 600-2000 | 20 | 5-20 | 0.1-1 | 0.005-0.5 | >200 |
| E8 | 2000-20000 | 30 | 5-50 | 0.1-1 | 0.005-0.5 | >200 |
| E9 | >20000 | 40 | 5-100 | 0.1-1 | 0.005-0.5 | >200 |
| C3 | >3000 | 10 | N/A | N/A | N/A | >200 |

Table 1 shows that among various working voltage levels, the exemplary semiconductor devices can work at a voltage level substantially the same as a comparative exemplary semiconductor device while retaining a relatively small gate thickness (i.e., the thickness T1 of the doped group III-V semiconductor layer 120) and a small distance D1 between the gate (i.e., the doped group III-V semiconductor layer 120) and the drain electrode.

FIGS. 6A, 6B, 6C, 6D and 6E illustrate several operations in manufacturing a semiconductor device according to some embodiments of the present disclosure. Although FIGS. 6A, 6B, 6C, 6D and 6E depict several operations for fabricating the semiconductor device 30, similar operations (with some changes for example) can also be used to fabricate the semiconductor device 10, 20, or 40.

Figure 6A:
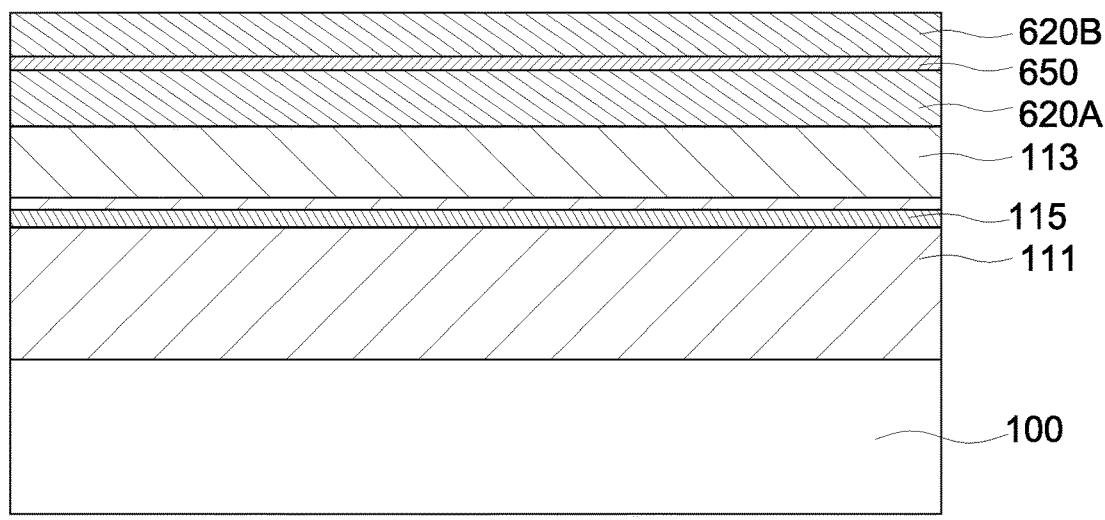
FIGS. 6A, 6B, 6C, 6D and 6E illustrate several operations in manufacturing a semiconductor device according to some embodiments of the present disclosure.

Referring to FIG. 6A, a nitride semiconductor layer 111 may be formed on a substrate 100. A nitride semiconductor layer 113 having a greater bandgap than that of the nitride semiconductor layer 111 may be formed on and in direct contact with a surface 111a of the nitride semiconductor layer 111. The nitride semiconductor layers 111 and 113 may be formed by epitaxial growth. As a heterojunction can be formed between the nitride semiconductor layer 111 and the nitride semiconductor layer 113, e.g., at an interface of the nitride semiconductor layer 111 and the nitride semiconductor layer 113, a 2DEG region 115 may be formed adjacent to the interface of the nitride semiconductor layer 111 and the nitride semiconductor layer 113.

Still referring to FIG. 6A, a doped group III-V semiconductor layer 620A may be formed on the nitride semiconductor layer 113. An etch stop layer 650 may be formed on the doped group III-V semiconductor layer 620A. A doped group III-V semiconductor layer 620B may be formed on the etch stop layer 650. The doped group III-V semiconductor layers 620A and 620B may be formed by epitaxial growth. The etch stop layer 650 may be formed by epitaxial growth or any suitable deposition process.

Figure 6B:
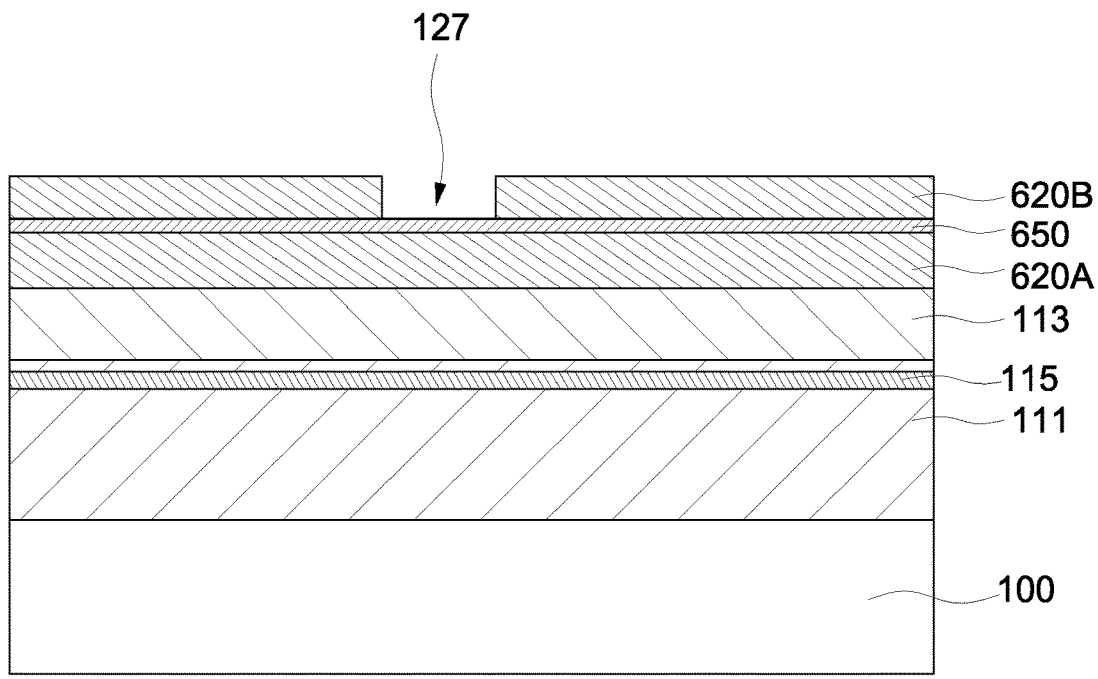

Referring to FIG. 6B, a recess 127 may be formed in the doped group III-V semiconductor layer 620B. A portion of the doped group III-V semiconductor layer 620B may be removed by an etching process to form the recess 127. The etching process may be performed on the doped group III-V semiconductor layer 620B and stopped at the etch stop layer 650. A portion of the etch stop layer 650 may be exposed from the recess 127.

Figure 6C:
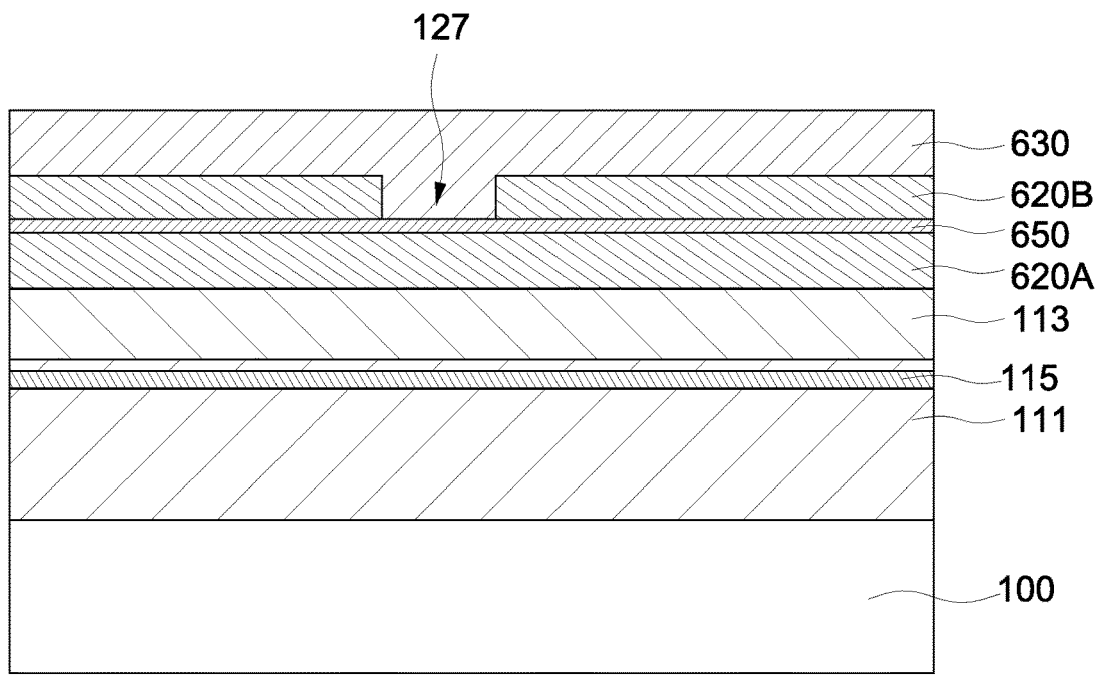

Referring to FIG. 6C, a gate layer 630 may be formed on the doped group III-V semiconductor layer 620B and filled in the recess 127. The gate layer 630 may directly contact a portion (e.g., the portion exposed from the recess 127) of the etch stop layer 650. The gate layer 630 may be formed by sputtering technique.

Figure 6D:
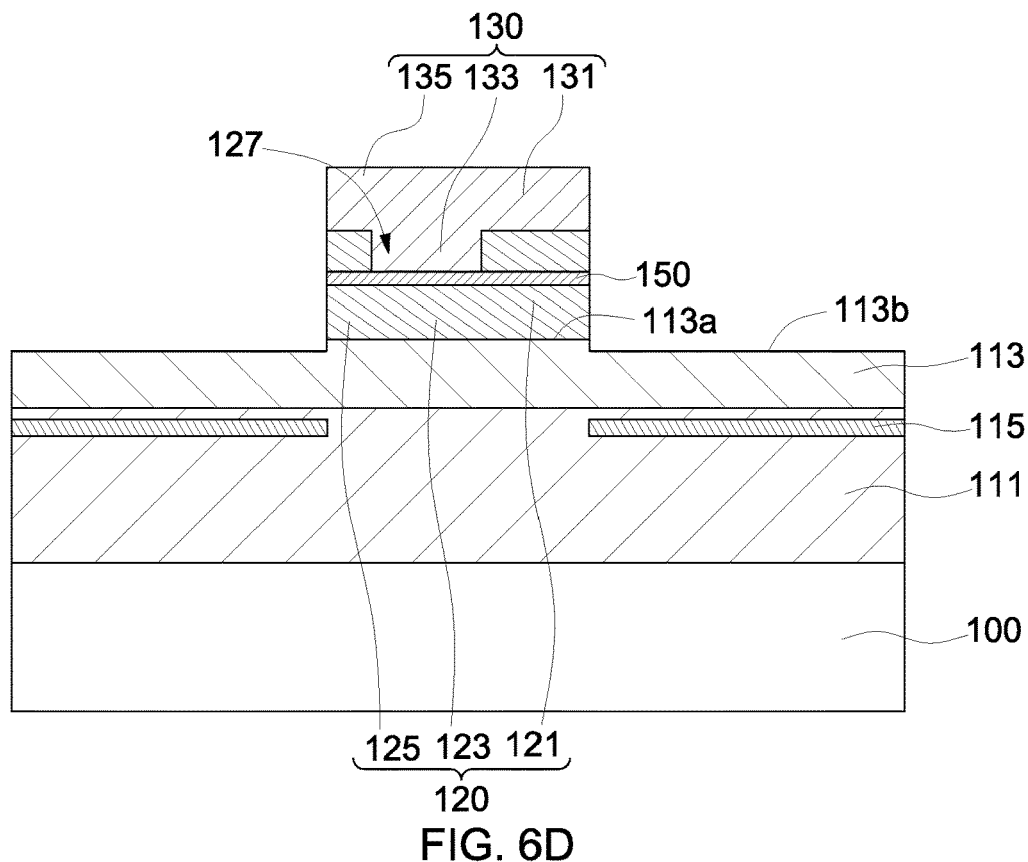
Figure 6E:
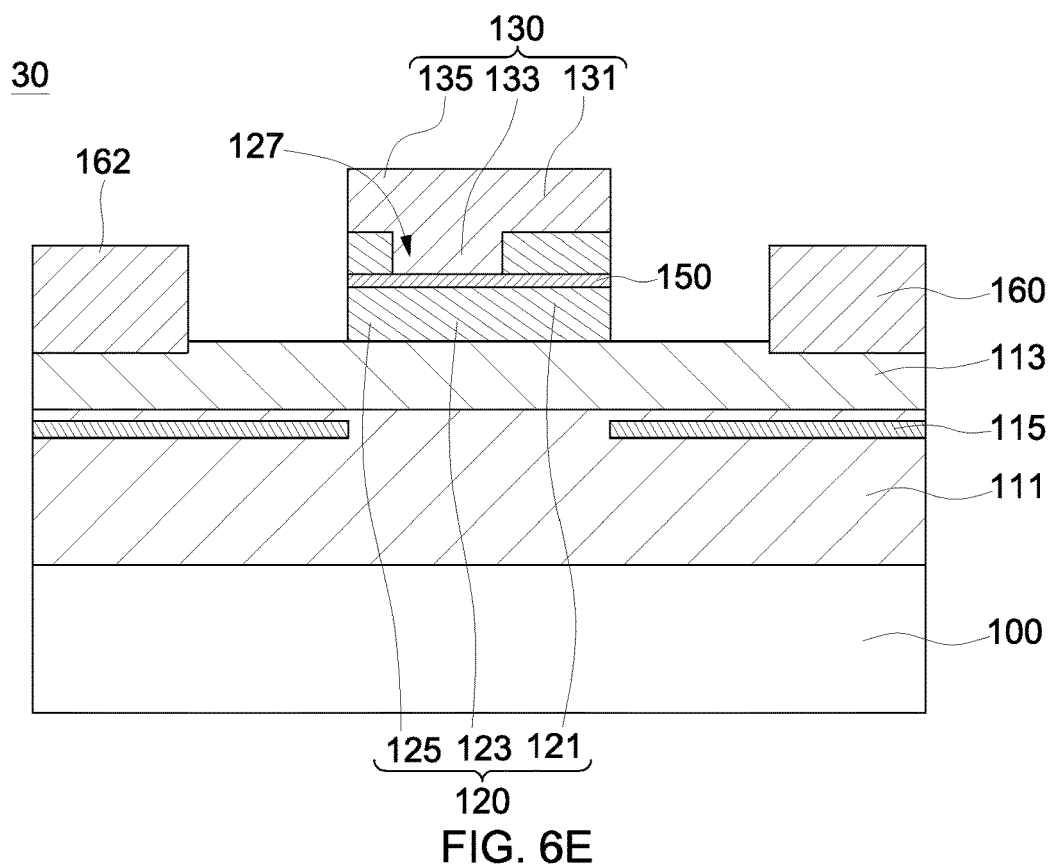

Referring to FIG. 6D, portions of the doped group III-V semiconductor layers 620A and 620B may be removed to expose a portion of the nitride semiconductor layer 113. A portion of the etch stop layer 650 may be removed with the removal of the portions of the doped group III-V semiconductor layers 620A and 620B. A portion of the gate layer 630 may be removed with the removal of the portions of the doped group III-V semiconductor layers 620A and 620B.

A patterning technique may be performed on the doped group III-V semiconductor layers 620A and 620B, the gate layer 630, and the etch stop layer 650. The patterning technique may be performed by disposing a patterned etch mask over the gate layer 630, and etching the doped group III-V semiconductor layers 620A and 620B, the gate layer 630, and the etch stop layer 650 using the patterned etch mask to remove portions of the doped group III-V semiconductor layers 620A and 620B, the gate layer 630, and the etch stop layer 650, so as to form a doped group III-V semiconductor layer 120 over the nitride semiconductor layer 113 and a gate layer 130 on the doped group III-V semiconductor layer 120. A portion of the nitride semiconductor layer 113 exposed from the patterned etch mask may be over-etched to form a recessed surface 113b. The surface 113b may be at an elevation lower than that of the surface 113a of the nitride semiconductor layer 113 under the doped group III-V semiconductor layer 120. The gate layer 130 may include a portion 133 extending into the recess 127 of the doped group III-V semiconductor layer 120. As such, the semiconductor device 30 as illustrated in FIG. 3 is formed.

As used herein, spatially relative terms, such as "beneath," "below," "lower," "above," "upper," "over," "left," "right" and the like, may be used herein for ease of description to describe one element or feature's relationship to another element(s) or feature(s) as illustrated in the figures.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately," "substantially," "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other techniques and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device, comprising:
   a first nitride semiconductor layer having a first surface;
   a second nitride semiconductor layer formed on the first surface of the first nitride semiconductor layer and having a greater bandgap than that of the first nitride semiconductor layer;
   a doped group III-V semiconductor layer over the second nitride semiconductor layer, wherein the doped group III-V semiconductor layer comprises a first portion and a second portion having different thicknesses;
   a gate layer disposed on the first portion and the second portion of the doped group III-V semiconductor layer; and
   a drain electrode disposed proximal to the first portion of the doped group III-V semiconductor layer, wherein the first portion of the doped group III-V semiconductor layer is located between the second portion of the doped group III-V semiconductor layer and the drain electrode,
   wherein a thickness of the first portion of the doped group III-V semiconductor layer is greater than a thickness of the second portion of the doped group III-V semiconductor layer,
   wherein along a direction parallel to the first surface of the first nitride semiconductor layer, a width of the first portion of the doped group III-V semiconductor layer is greater than a width of the second portion of the doped III-V semiconductor layer.

2. The semiconductor device according to claim 1, wherein the gate layer directly contacts the first portion and the second portion of the doped group III-V semiconductor layer.

3. The semiconductor device according to claim 1, wherein the doped group III-V semiconductor layer further comprises a third portion, the second portion is between the first portion and third portion.

4. The semiconductor device according to claim 3, wherein a thickness of the third portion of the doped group III-V semiconductor layer is greater than the thickness of the second portion of the doped group III-V semiconductor layer.

5. The semiconductor device according to claim 3, wherein a thickness of the third portion of the doped group III-V semiconductor layer is substantially the same as the thickness of the first portion of the doped group III-V semiconductor layer.

6. The semiconductor device according to claim 1, wherein a difference between the thicknesses of the first portion and the second portion of the doped group III-V semiconductor layer is from about 5 nm to about 100 nm.

7. The semiconductor device according to claim 1, wherein the doped group III-V semiconductor layer has a first surface facing the gate layer, the first surface of the doped group III-V semiconductor layer comprising a first part and a second part adjacent to the first part, the first part and the second part being at different elevations.

8. A method for fabricating a semiconductor device, comprising:
   forming a first nitride semiconductor layer;
   forming a second nitride semiconductor layer on a first surface of the first nitride semiconductor layer, the second nitride semiconductor layer having a greater bandgap than that of the first nitride semiconductor layer;
   forming a doped group III-V semiconductor layer over the second nitride semiconductor layer, wherein the doped group III-V semiconductor layer comprises a first portion and a second portion having different thicknesses;
   forming a gate layer on the first portion and the second portion of the doped group III-V semiconductor layer; and
   forming a drain electrode proximal to the first portion of the doped group III-V semiconductor layer, wherein the first portion of the doped group III-V semiconductor layer is located between the second portion of the doped group III-V semiconductor layer and the drain electrode,
   wherein a thickness of the first portion of the doped group III-V semiconductor layer is greater than a thickness of the second portion of the doped group III-V semiconductor layer,
   wherein along a direction parallel to the first surface of the first nitride semiconductor layer, a width of the first portion of the doped group III-V semiconductor layer is greater than a width of the second portion of the doped III-V semiconductor layer.

* * * * *